United States Patent
Brauchle et al.

(10) Patent No.: US 8,347,190 B2
(45) Date of Patent: Jan. 1, 2013

(54) SYSTEMATIC ENCODER WITH ARBITRARY PARITY POSITIONS

(75) Inventors: Joschi Tobias Brauchle, Munich (DE); Ralf Koetter, Munich (DE); Nuala Koetter, legal representative, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 422 days.

(21) Appl. No.: 12/635,422

(22) Filed: Dec. 10, 2009

(65) Prior Publication Data

US 2011/0072334 A1  Mar. 24, 2011

(30) Foreign Application Priority Data

Sep. 23, 2009 (EP) .................................... 09171077
Nov. 4, 2009 (EP) .................................... 09175054

(51) Int. Cl.
*G06F 11/00* (2006.01)
(52) U.S. Cl. ........... 714/781; 714/801; 714/52; 714/785
(58) Field of Classification Search ........................ None
See application file for complete search history.

(56) References Cited

U.S. PATENT DOCUMENTS

2003/0099303 A1  5/2003  Birru et al.
2008/0115017 A1* 5/2008  Jacobson ...................... 714/710
2008/0270873 A1* 10/2008  Piret et al. .................... 714/784

FOREIGN PATENT DOCUMENTS

EP  0 584 864 A1  3/1994

OTHER PUBLICATIONS

Nonbinary BCH Codes, Chapter 7, pp. 240, 263, 264. XP-002571455.
ATSC Mobile DTV Standard, Part 2—RF/Transmission System Charaterisitcs, Advanced Television Systems Committee, A/153 Part 2, Oct. 15, 2009, pp. 1-94, XP-002571574.
Chien, R.T., "Cyclic Decoding Procedures for Bose-Chaudhuri-Hocquenghem Codes," IEEE Transactions on Information Theory, Oct. 1964, pp. 357-363, XP 000575336.

\* cited by examiner

*Primary Examiner* — Christopher McCarthy
(74) *Attorney, Agent, or Firm* — Foley & Lardner LLP

(57) ABSTRACT

An encoder structure for an error correcting code with arbitrary parity positions is presented. The invention is effective for all error correcting codes whose parity check matrix is of the Vandermonde type. In contrast to conventional encoder circuits, the parity symbols produced by this encoder are not restricted to form a block of consecutive parity symbols at the beginning or at the end of a codeword, but may be spread arbitrarily within the codeword. A general structure of the parity check matrix for such a code is found by exploiting the special Vandermonde structure of matrices. From this general parity check matrix, an expression for the evaluation of the parity symbols in terms of a polynomial with limited degree is derived. An efficient hardware implementation of the proposed encoder is suggested.

23 Claims, 5 Drawing Sheets

US 8,347,190 B2

SYSTEMATIC ENCODER WITH ARBITRARY PARITY POSITIONS

TECHNICAL FIELD

The present invention relates to an encoding circuit for data transmission from a source to a destination over a communication channel by means of an error-correcting code.

BACKGROUND AND STATE OF THE ART

Reliable data transmission over a communication channel is fundamental in all fields of information and communication technology. Unfortunately, most communication channels in the real world are noisy, so that the signal is distorted on its way from the sender to the receiver. Signal distortions can be due both to imperfections of the sender and/or receiver equipment, or to external influences during transmission. Error-correcting codes have been developed to identify and correct such errors, so that, after correction, the recipient receives a (nearly) exact copy of the data transmitted by the sender with a high level of certainty. Typically, the particular code is chosen based on some information about the infidelities of the channel through which the data is transmitted, as well as the nature of the data.

A class of error-correcting codes with high practical relevance are Reed-Solomon error-correcting codes, which protect messages by constructing a polynomial from the raw data. The polynomial is evaluated at several points, and these values are sent or recorded. Sampling the polynomial more often than necessary makes the polynomial over-determined, and as long as the recipient receives sufficiently many of these points correctly, she or he can recover the original polynomial even in the presence of transmission errors. Reed-Solomon codes are used in a wide variety of commercial applications, both for data storage on CDs, DVDs and blue ray discs as well as in broadcast systems such as digital television. They are particularly efficient to protect against burst errors, in which a whole train of subsequent data symbols is corrupted.

Reed-Solomon error-correcting codes can be encoded as "systematic codes", i.e., the codeword contains the input data in its original form plus some parity symbols. The values of the parity symbols allow the decoder to determine whether the data has been lost or corrupted during transmission, and to correct for transmission errors. In conventional systematic Reed-Solomon encoding schemes, a block of parity symbols is simply appended or pre-appended to the un-altered block of (raw) data symbols.

In contrast, the upcoming ATSC mobile/handheld digital television standard (ATSC-M/H) is based on a Reed-Solomon code in which the parity symbols are no longer arranged in a block of consecutive symbols, but may be spread arbitrarily within the codeword. Section 5.4.9 and Table A.1 of the specification "ATSC-M/H Standard, Part 2, RF/Transmission System Characteristics (A/153, Part 2: 2009)", published by the Advanced Television Systems Committee, suggest a systematic t=10 error-correcting Reed-Solomon code of length n=207 and dimension k=n−2×t=187 defined over the finite field $IF_{256}$. The 2×t=20 parity symbols are supposed to be inserted according to one out of 118 different parity patterns, which specify the positions of the parity symbols in the codeword. These parity positions may differ from codeword to codeword. Conventional encoding circuits are adapted to codewords in which the parity symbols are arranged blockwise at fixed positions, and hence cannot be used to provide codewords with arbitrary parity positions.

OBJECT OF THE PRESENT INVENTION

It is hence the object of the present invention to provide an encoder which allows to efficiently and quickly produce codewords with parity positions according to any predefined parity pattern.

SUMMARY OF THE INVENTION

This objective is achieved by a method of encoding data with the features of independent claim 1 as well as by providing an encoder with the features of independent apparatus claim 11. The dependent claims relate to preferred embodiments.

The method of encoding data for transmission from a source to a destination over a communication channel by means of an error-correcting code according to the present invention comprises the steps of receiving a plurality of data symbols and preparing at least one codeword of said error-correcting code at an encoding station, said codeword to be transmitted over said communication channel and comprising said plurality of data symbols and a plurality of parity symbols. Said step of preparing said codeword comprises the steps of selecting one out of a plurality of parity patterns, said parity pattern determining the positions at which said parity symbols are located within said codeword, and determining said parity symbols on the basis of said data symbols and said selected parity pattern, characterized in that determining at least one of said parity symbols is based on a step of evaluating a polynomial of a degree that is no larger than the number of parity symbols in said codeword.

It is the surprising finding of the present invention that the step of determining the parity symbols at arbitrary parity positions can be reduced to the evaluation of a polynomial of a degree that is no larger than the number of parity symbols. Evaluation of such a polynomial is fast, can be implemented efficiently and requires only very limited hardware and storage capabilities. This allows the encoder to determine the parity symbols and to produce the corresponding codewords for transmission "on the fly", i.e., as the data symbols are received by the encoder. As a result, the encoding rate, and hence the transfer rate at which signals can be sent from the receiver to the recipient can be enhanced. At the same time, the hardware and storage requirements for implementing the encoder are reduced.

The present invention is not limited to Reed-Solomon codes, but is effective at least whenever the error-correcting code is defined by a parity check matrix having a Vandermonde structure, i.e., whenever the parity check matrix H or its transpose satisfy the equation $(H)_{ij}=a_j^i$ for some set $\{a_0, a_1, \ldots, a_{n-1}\}$ of n distinct and nonzero elements of a finite field, $i=0, \ldots, 2\cdot t-1; j=0, \ldots, n-1$.

The present invention is equally effective when the parity check matrix comprises a matrix having a Vandermonde structure, for example when the parity check matrix H is a product $H=V\cdot Y$, where V has a Vandermonde structure. The factor Y may be a diagonal matrix with non zero (but not necessarily distinct) elements of the finite field. Codes defined by a parity check matrix of its form are sometimes called Alternant Codes.

According to a preferred embodiment, said polynomial is a Lagrange polynomial, i.e.

$$\Lambda^{(j)}(a_{i_k}) = \begin{cases} \dfrac{1}{y_{i_j}} & \text{for } k = j, \\ 0 & \text{for } k \neq j, \end{cases} \quad (1)$$

wherein $\{a_0, a_1, \ldots, a_{n-1}\}$ is a set of n distinct and non-zero elements of a finite field the positive integer n denoting the length of said codeword (c) $\{y_0, y_1, \ldots, y_{n-1}\}$ is a set of n non-zero elements of a finite field, j is a positive integer denoting the parity symbol, and $i_k$ is a positive integer denoting the position of the k-th parity symbol in said codeword according to said selected parity pattern.

According to a preferred embodiment, $y_{i_j}=1$ for some or all $y_{i_j}$, 1 denoting a unit element of said field.

It is a finding of the present invention that the step of determining said parity symbols can be reduced to the step of evaluating a Lagrange polynomial. Due to the simple form of this polynomial, the efficiency of determining the parity symbols can be further enhanced.

In a preferred embodiment, the j-th parity symbol can be determined by evaluating the equation $$P_j = \sum_{\ell=0}^{n-1} \hat{c}_\ell \cdot \Lambda^{(j)}(a_\ell). \quad (2)$$

for every parity symbol $P_j$, where n denotes the length of said codeword, $\Lambda^{(j)}$ denotes a polynomial of a degree that is no larger than the number of parity symbols in said codeword, $\{a_0, a_1, \ldots, a_{n-1}\}$ is a set of n distinct and non-zero elements of a finite field, $i_k$ is a positive integer denoting the position of the k-th parity symbol in said codeword according to said selected parity pattern, and $\hat{c}_\ell$ equals the data symbol at position l of said codeword if l does not denote a position of a parity symbol in said codeword, or equals 0 if l denotes a position of a parity symbol in said codeword.

According to a preferred embodiment, $a_k = \alpha^k$ for all $k=0, \ldots, n-1$, wherein $\alpha$ denotes a primitive element of said field. In this embodiment, the columns of the parity check matrix H are formed by forming the respective powers of n subsequent powers of the primitive element, i.e., $(H)_{ij} = a^{i \cdot j}$. A parity check matrix of this form corresponds to a regular Reed-Solomon code, a very important class of codes. The method according to the present invention allows for a particularly efficient determination of the parity symbols of regular Reed-Solomon codes.

According to a further embodiment, said step of determining said parity symbols comprises a step of evaluating said polynomial of a degree no larger than the number of parity symbols, and further evaluating its derivative, wherein said polynomial is independent of said parity symbols.

It is the surprising finding of the inventors that the step of determining said parity symbols can be based on the step of evaluating a polynomial which is one and the same for all the parity symbols to be determined. According to this embodiment, only a single polynomial needs to be evaluated to determine the plurality of parity symbols in said codeword. Accordingly, the speed and efficiency of the encoding circuit can be further enhanced.

In a further embodiment, said step of determining said parity symbols comprises a step of evaluating a ratio of said polynomial at an element of a finite field and said element itself, and further evaluating said derivative of said polynomial.

According to a preferred embodiment, said plurality of parity symbols are solely defined in terms of the roots of said polynomial and the position of the parity symbol within said codeword.

In further embodiment, the j-th parity symbol is determined by evaluating the equation $$P_j = \frac{1}{y_{i_j}} \frac{1}{\Lambda'(a_{i_j})} \cdot \sum_{l=0}^{n-1} \hat{c}_l \cdot \frac{\Lambda(a_l)}{a_l} \cdot \frac{1}{1 - a_{i_j}/a_l} \quad (3)$$

for every parity symbol $P_j$, wherein n denotes the length of said codeword (c), $\Lambda$ denotes a polynomial of the degree that is no larger than the number of parity symbols and said codeword (c), said polynomial $\Lambda$ being independent of said parity symbols $P_j$, $\{a_0, a_1, \ldots, a_{n-1}\}$ is a set of n distinct and non-zero elements of a finite field, $\Lambda'$ denotes the first derivative of $\Lambda$, $i_j$ is positive integer denoting the position of the j-th parity symbol in said codeword, $\{y_0, y_1, \ldots, y_{n-1}\}$ is a set of n non-zero elements of a finite field, and $\hat{c}_l$ equals the data symbol at position l of said codeword if l does not denote a position of a parity symbol in said codeword, or equals 0 if l denotes the position of a parity symbol in said codeword.

According to the latter embodiment, each parity symbol $P_j$ can be determined by evaluating a polynomial $\Lambda$ which is independent of the position of the parity symbol in said codeword, and by further evaluating its derivative $\Lambda'$ on an element $a_{i_j}$ that depends on the position of the corresponding parity symbol in said codeword. The remaining terms in Eq. (3) are likewise easy and quick to evaluate, and hence the step of determining the parity symbols reduces to a sequence of standard operations for which an efficient implementation exists.

According to a preferred embodiment, said parity symbols are not arranged in a single block at the beginning or the end of said codeword. The method of the present invention allows to produce encrypted codewords with parity symbols that may be spread arbitrarily within said codewords.

According to a further embodiment, said parity symbols are determined by means of a Chien search. A Chien search provides a very efficient architecture for evaluating said polynomial of a degree no larger than a number of parity symbols in said codeword, and simultaneously evaluating its derivative.

In an embodiment of the present invention, the method further comprises a step of permuting the data symbols before preparing said codeword.

By permuting the data symbols, the step of determining the parity symbols can be reduced to the determination of the parity symbols of a code with a simpler parity check matrix, for instance a parity check matrix of a regular Reed-Solomon code. As described above, the method according to the present invention is particularly effective when determining parity symbols of a regular Reed-Solomon code. Hence, permutation of the code symbols allows to increase the efficiency of determining the parity symbols of a generalized Reed-Solomon code or alternant code by reducing it to a regular Reed-Solomon code.

After the determination of the parity symbols, another permutation may serve to restore the original order. Alternatively, the data symbols may be sent over the communication channel in their permuted order, and may be restored to their former order only at the receiving station (destination).

The invention also relates to a storage medium storing instructions readable by a computing device, such that the computing device, when executing said instructions, implements a method with some or all of the features described above.

The invention further relates to an encoder for encoding data to be transmitted from a source to a destination over a communication channel by means of an error-correcting code, said error-correcting code being defined by a parity check matrix having or comprising a Vandermonde structure, wherein said encoder comprises encoding means adapted to receive a plurality of data symbols and to prepare at least one codeword of said error-correcting code, said codeword to be transmitted over said communication channel and comprising said plurality of data symbols and a plurality of parity symbols. The encoder further comprises pattern selection means adapted to select one out of a plurality of parity patterns, said parity pattern determining the positions at which said parity symbols are located within said codeword, characterized in that said encoder is adapted to determine said parity symbols on the basis of said data symbols and said selected parity pattern by evaluating a polynomial of a degree that is no larger than the number of parity symbols in said codeword.

As described above, an encoder according to the present invention allows the quick and efficient encoding of codewords with arbitrary parity positions.

According to a preferred embodiment, said encoder is adapted to determine said parity symbols by evaluating said polynomial and further evaluating its derivative, said polynomial being independent of said parity symbols.

In a further embodiment, said encoder is adapted to determine said parity symbols by evaluating a ratio of said polynomial at an element of a finite field and said element itself, and further evaluating said derivative of said polynomial.

In a preferred embodiment, the encoder comprises a first summing circuit, a second summing circuit, and a third summing circuit, said third summing circuit connecting an output line of said first summing circuit to an output line of said second summing circuit, wherein said first summing circuit comprises a plurality of first registers adapted to hold a plurality of even powers of a primitive element of a finite field and a corresponding number of first coefficients, said second summing circuit comprises a plurality of second registers adapted to hold a plurality of odd powers of said primitive element and a corresponding number of second coefficients, and said third summing circuit is adapted to add an output of said first summing circuit to an output of said second summing circuit.

The encoder according to the latter embodiment takes into account that both the terms $\Lambda(x)/x$ and $\Lambda'(x)$ evaluated in determining the parity symbols share monomials comprising the even powers of x. The circuit architecture according to the latter embodiment allows to evaluate the even powers of the primitive element in the first summing circuit, and to simultaneously evaluate the odd powers in the second summing circuit. By adding an output of said first summing circuit to an output of said second summing circuit in said third summing circuit, both terms required for evaluating the value of the parity symbols can be computed simultaneously and with minimal resources, and the overall efficiency of the circuit is further enhanced.

Preferably, said first registers and/or said second registers each comprise a feedback loop for said even and odd powers of said primitive element, respectively.

By means of said feedback loop, said registers allow to compute the values of the polynomial $$\frac{\Lambda(\alpha^l)}{\alpha^l}$$

and $\Lambda'(\alpha^l)$ successively for each $l=0, \ldots, n-1$, without having to reinitialize said registers. Consequently, the parity symbols can be evaluated faster and more efficiently.

According to a further embodiment, the encoder comprises a first summing circuit, a second summing circuit, a third summing circuit, and an initialization register. Said first summing circuit comprises a plurality of first registers adapted to hold a plurality of even powers of an element of a finite field and a corresponding number of first coefficients. Said second summing circuit comprises a plurality of second registers adapted to hold a plurality of odd powers of said element and a corresponding number of second coefficients. Said initialization register is adapted to initialize said first registers and said second registers with said even and odd powers of said element, respectively, wherein said third summing circuit connects an output line of said first summing circuit to an output line of said second summing circuit, and is adapted to add an output of said first summing circuit to an output of said second summing circuit.

The initialization register allows to efficiently provide the code locator elements to the respective summing circuit, and hence to evaluate said parity symbols even if the code locator elements $a_l$ are not consecutive powers of a primitive element $\alpha$.

According to a further embodiment, said encoding means comprises interleaving means adapted to permute said data symbols before preparing said codeword.

As explained above, permuting said data symbols allows to reduce the determination of the parity symbols of a generalized Reed-Solomon code or alternant code to the determination of the parity symbols of a regular Reed-Solomon code.

According to a further embodiment, the encoder comprises an inversion circuit adapted to invert the output of said first summing circuit.

DETAILED DESCRIPTION OF PREFERRED EMBODIMENTS

The numerous features and advantages of the present invention will now be described with reference to the accompanying figures, in which.

Figure 1:
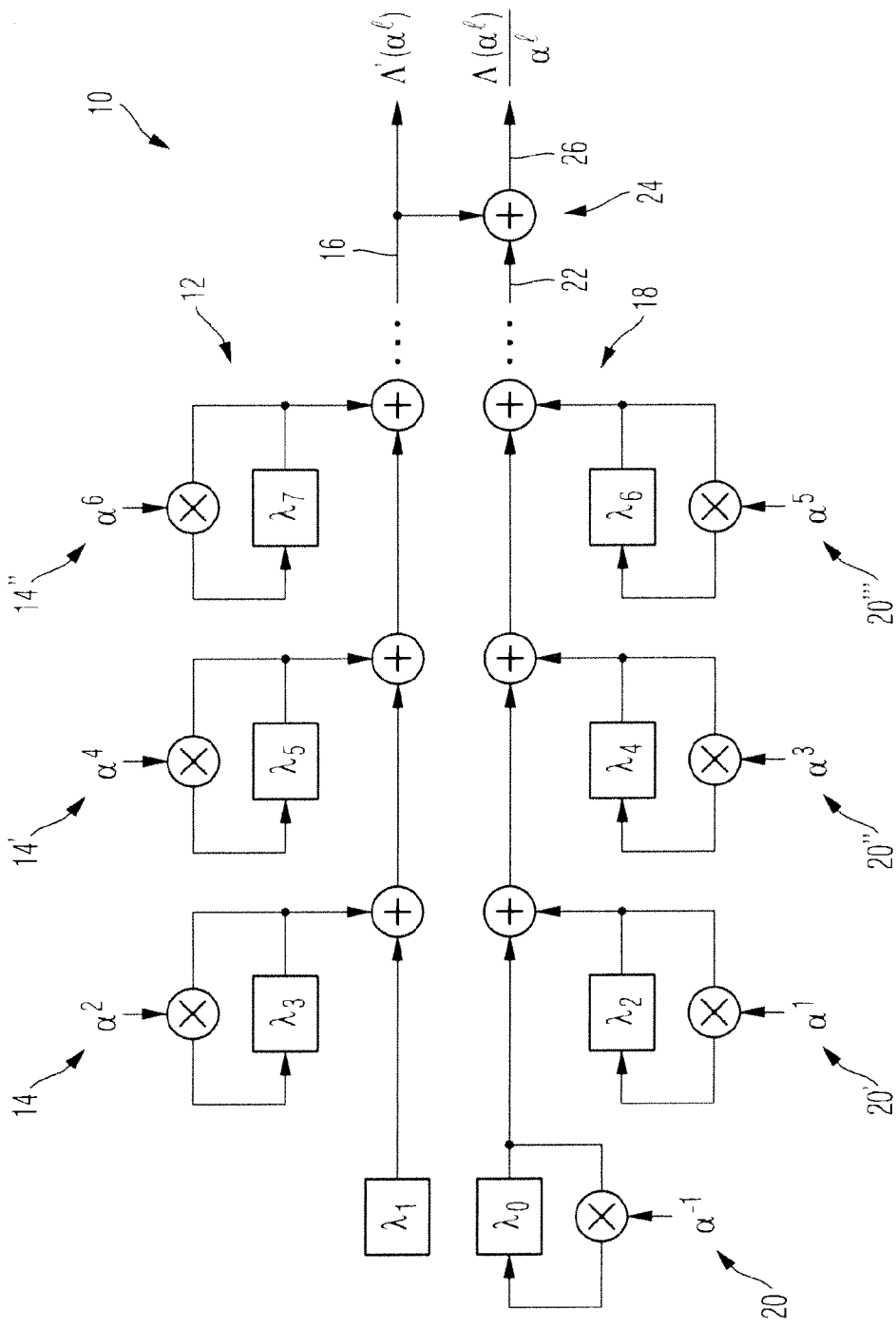
FIG. 1 is a schematic circuit diagram illustrating the simultaneous evaluation of the parity locator polynomial and its derivative in a Chien search according to a first embodiment of the present invention.

The method and system according to the present invention are effective whenever data is to be transmitted from a source to a destination over a communication channel by means of an error-correcting code defined by a parity check matrix having or comprising a Vandermonde structure. These include regular or generalized Reed-Solomon codes, alternant codes, BCH codes as well as other codes based on Vandermonde-like parity check matrices. In particular, the invention may be applied to all codes whose parity check matrix is a product of a Vandermonde matrix (or its transpose) and a diagonal matrix.

The communication channel may model data transmission both through space and/or through time, such as data transmitted from one location to another or data stored at one time and used at another. Channels in space can be wires, networks, fibers, wireless media etc. between a sender and a receiver. Channels in time can be data storage devices such as CDs or DVDs. The channel is a description or model for the transformation the data undergoes on its way from a source (or sender) to a destination (or receiver) separated in time and/or space.

For concreteness, the invention will now be described in further detail for the example of a systematic regular Reed-Solomon code over a finite field. However, it will be apparent to those skilled in the art that the invention is not limited to such codes, and some exemplary generalizations will subsequently be discussed.

1. Definition of a Systematic Regular Reed-Solomon Code

Let $\{\alpha^0, \alpha^1, \ldots, \alpha^{n-1}\} \in \mathrm{IF}_q$ be a set of n<q distinct and nonzero elements of a finite field $\mathrm{IF}_q$, where the positive integer q denotes the size of the field $\mathrm{IF}_q$. A t-error-correcting Reed-Solomon code (RS code) of length n and dimension k over the field $\mathrm{IF}_q$ may be defined as $$C_{RS} = \left\{ \underline{c} \in \mathrm{IF}_q^n : \sum_{i=0}^{n-1} c_i \alpha^{i \cdot j} = 0, \quad j = 0, \ldots, 2t-1 \right\}, \quad (4)$$

where t and k are positive integers satisfying the relation 2t=n−k. The elements $\alpha^i \in \mathrm{IF}_q$, i=0, ..., n−1, are consecutive powers of the primitive element α of $\mathrm{IF}_q$ and commonly called "code locators". In digital communications, the field size q is often restricted to powers of 2, so that all elements of $\mathrm{IF}_q$, $q=2^m$, can be uniquely represented by a vector of m bits.

For instance, the error-correcting code suggested for the upcoming ATSC mobile/handheld digital television standard is a systematic t=10 error-correcting Reed-Solomon code of length n=207 and dimension k=n−2·t=187, defined over the finite field $\mathrm{IF}_{256}$. However, the method and system according to the invention can be applied to codes of other lengths n and other dimensions k.

As Reed-Solomon codes are linear block codes, they can be expressed as the set of all vectors $\underline{c} \in \mathrm{IF}_q^n$ lying in the null space (kernel) of a parity check matrix H, i.e., $$C_{RS} = \{\underline{c} \in \mathrm{IF}_q^n : H\underline{c}^T = \underline{0}\}. \quad (5)$$

The codeword c of total length n comprises k data symbols to be transmitted, as well as 2·t parity symbols used to identify and correct transmission errors. A parity check matrix of this Reed-Solomon code, $$H = \begin{pmatrix} 1 & 1 & 1 & \cdots & 1 \\ \alpha^0 & \alpha^1 & \alpha^2 & \cdots & \alpha^{n-1} \\ \vdots & \vdots & \vdots & & \vdots \\ \alpha^{0 \cdot (2t-1)} & \alpha^{1 \cdot (2t-1)} & \alpha^{2 \cdot (2t-1)} & \cdots & \alpha^{(n-1) \cdot (2t-1)} \end{pmatrix}, \quad (6)$$

is a 2t×n Vandermonde matrix, where each column $\underline{h}_i^T$ consists of 2t consecutive powers of the corresponding code locator element $\alpha^i$ for i=0, n−1. In matrix notation, $(H_{ji}) = a^{i \cdot j}$ for the primitive element $\alpha \in \mathrm{IF}_q$; i=0, ..., n−1; j=0, ..., 2t−1.

For any linear code C there always exists an equivalent systematic code $C_{sys}$, producing codewords of the form $$C_{sys} = (I_0, I_1, \ldots, I_{k-1}, P_0, P_1, \ldots, P_{2t-1}) \quad (7)$$

where $I_l$, l=0, k−1 denote k consecutive data symbols, and $P_j$, j=0, ..., 2t−1 denote the parity symbols of the codeword $c_{sys}$. Eq. (7) represents codewords of a conventional RS code, in which all the parity symbols are grouped into a single block, and are appended to the block of data symbols. Alternatively, in a conventional RS code the block of parity symbols may also be pre-appended to the block of data symbols.

Combining Equations (5) and (7), a systematic parity check matrix $H_{sys}$ may be given the form, $$H_{sy}(P \mid I_{2t})_s = = \left( P \left| \begin{matrix} 1 & \cdots & 0 \\ \vdots & \ddots & \vdots \\ 0 & \cdots & 1 \end{matrix} \right. \right) \quad (8)$$

where $I_{2t}$ denotes a 2t×2t identity matrix. The submatrix P that defines the parity check relations can be found by translating the original (non-systematic) parity check matrix $H=1(A|B_{2t})$ into its equivalent systematic form $H_{sys}$ by left-multiplying H with the inverse $B_{2t}^{-1}$ of the submatrix $B_{2t}$, $$H_{sys} = B_{2t}^{-1} H, \text{ and hence } P = B_{2t}^{-1} A. \quad (9)$$

Due to its origin as a submatrix of H, $B_{2t}$ is a 2t×2t Vandermonde matrix as well. As long as the code locator elements $\alpha^i$ are distinct and nonzero, a Vandermonde matrix is of full rank and nonsingular. Consequently, $B_{2t}$ will be nonsingular, and its inverse $B_{2t}^{-1}$ will exist.

2. A Systematic Reed-Solomon Code with Arbitrary Parity Positions

According to the upcoming ATSC mobile/handheld digital television standard, parity symbols may no longer be appended or pre-appended in a single block to the block of data symbols, but may be located at arbitrary positions $i_j \in [0, n-1]$, j=0, ... 2t−1, within a codeword $\tilde{c}_{RS}$, e.g., $$\tilde{c}_{RS} = (I_0, I_1, \ldots, P_0, \ldots, P_1, \ldots, P_{2t-1}, \ldots, I_{k-1}), \quad (10)$$

The set $\{i_j\}_{j=0, \ldots, 2t-1}$ defines a parity pattern, i.e., a set of positions at which the parity symbols $P_j$ are located within the codeword $\tilde{c}_{RS}$. Together with the data symbols, one of a plurality of parity patterns $\{i_j\}_{j=0, \ldots, 2t-1}$ is selected and received at the encoding station. The encoder then needs to determine a codeword $\tilde{c}_{RS}$ with the selected parity pattern and hence its parity symbols $(P_j)_{j=0, \ldots, 2t-1}$ on the basis of the data symbols $(I_l)_{l=0, \ldots, k-1}$ and the selected parity pattern $\{i_j\}_{j=0, \ldots, 2t-1}$. To this end, the parity check matrix can be transformed to the form $$\tilde{H} = \left( P \ldots \left| \begin{matrix} 1 \\ 0 \\ \vdots \\ 0 \end{matrix} \right. \ldots P' \ldots \left| \begin{matrix} 0 \\ 1 \\ \vdots \\ 0 \end{matrix} \right. \ldots P'' \ldots \left| \begin{matrix} 0 \\ 0 \\ \vdots \\ 1 \end{matrix} \right. \ldots P''' \right) \quad (11)$$

code locator index = $i_0 i_l i_{2t-1}$ where the locations $i_j$ of the canonical unit vectors $\underline{e}_j$ within $\tilde{H}$ specify the locations of the parity symbols $P_j$ within the codeword $\tilde{c}_{RS}$. As in Eq. (9) above, $\tilde{H}$ can be expressed in terms of $H$ and some matrix $\tilde{B}$, such that $$\tilde{H} = \tilde{B}^{-1} H. \tag{12}$$

To satisfy this relationship, the matrix $\tilde{B}$ must be composed of the columns $\underline{h}_{i_0}^T, \ldots, \underline{h}_{i_{2t-1}}^T$ of the original $H$, i.e., $$\tilde{B} = \begin{pmatrix} | & | & & | \\ \underline{h}_{i_0}^T & \underline{h}_{i_1}^T & \cdots & \underline{h}_{i_{2t-1}}^T \\ | & | & & | \end{pmatrix} \tag{13}$$

$$= \begin{pmatrix} 1 & 1 & \cdots & 1 \\ \alpha^{i_0} & \alpha^{i_1} & \cdots & \alpha^{i_{2t-1}} \\ \vdots & \vdots & & \vdots \\ \alpha^{i_0 \cdot (2t-1)} & \alpha^{i_1 \cdot (2t-1)} & \cdots & \alpha^{i_{2t-1} \cdot (2t-1)} \end{pmatrix}$$

From Eq. (13) it can be seen that $\tilde{B}$ is again a 2t×2t Vandermonde matrix consisting of distinct elements $\alpha^{i_j}$, thus its inverse $\tilde{B}^{-1}$ is guaranteed to exist.

Based on these considerations, a rather straightforward (but inefficient) way of determining the parity symbols of a Reed-Solomon code with arbitrary parity positions would be an inversion of the transfer matrix $\tilde{B}$ for each of the relevant parity patterns. The parity check matrix $\tilde{H}$ could then be computed according to Eq. (12). However, the inversion of a (large) matrix $\tilde{B}$ is computationally rather complex and requires a lot of resources. It cannot be performed "on the fly", as the data symbols to be transmitted arrive at the encoder. Hence, the inverses $\tilde{B}^{-1}$ would need to be pre-computed and stored at the encoding station for each of the plurality of different parity patterns that may be selected for encryption. There may be many different such parity patterns. For instance, the ATSC-M/H Standard prescribes 118 different patterns, resulting in total storage requirements of $$(118 \text{ patterns}) \times (187 \text{ columns/pattern}) \times (20 \text{ bytes/column}) = 441{,}320 \text{ bytes.} \tag{14}$$

3. Efficient Determination of the Parity Symbols

As explained above, the two biggest obstacles in finding an efficient and compact encoder are the computationally very complex inversion of $\tilde{B}$ on the one hand, and the storage requirements for $\tilde{H}$ on the other. It is the surprising finding of the present invention that both obstacles can be circumvented by exploiting the special Vandermonde structure of the parity check matrix. The idea is to make use of the fact that the inner product of some arbitrary vector $$\underline{a} = (a_0, a_1, a_2, \ldots a_{2t-1}) \in IF_q^{2t} \tag{15}$$

and a Vandermonde vector $\underline{v}$, consisting of 2t consecutive powers of $\alpha^{i_j}$, $$\underline{v} = (1, \alpha^{1 \cdot i_j}, \alpha^{2 \cdot i_j}, \ldots, \alpha^{(2t-1) \cdot i_j}) \in IF_q^{2t} \tag{16}$$

i.e.

$$\langle \underline{a}, \underline{v} \rangle = a_0 + a_1 \cdot \alpha^{1 \cdot i_j} + a_2 \cdot \alpha^{2 \cdot i_j} + \ldots + a_{2t-1} \cdot \alpha^{(2t-1) \cdot i_j} = A(\alpha^{i_j}), \tag{17}$$

is equivalent to the evaluation of a polynomial $A(x) \in IF_q[x]$ of degree $2t-1$ and coefficient vector $a$ with the element $\alpha^{i_j}$. $IF_q[x]$ denotes the ring of polynomials with coefficients from the field $IF_q$.

The inner product of the j-th row of $\tilde{B}^{-1}$, denoted by $\lambda^{(j)}$, and the l-th column $\underline{h}_l^T$ of $H$ results in $$\langle \lambda^{(j)}, \underline{h}_l \rangle = \lambda_0^{(j)} \cdot 1 + \lambda_1^{(j)} \cdot \alpha^l + \ldots + \lambda_{2t-1}^{(j)} \cdot \alpha^{l \cdot (2t-1)} = \Lambda^{(j)}(\alpha^l), \tag{18}$$

and with this insight, Eq. (12) becomes $$\tilde{H} = \tilde{B}^{-1} H \tag{19}$$

$$= \begin{pmatrix} \lambda_0^{(0)} & \lambda_1^{(0)} & \cdots & \lambda_{2t-1}^{(0)} \\ \lambda_0^{(1)} & \lambda_1^{(1)} & \cdots & \lambda_{2t-1}^{(1)} \\ \vdots & \vdots & & \vdots \\ \lambda_0^{(2t-1)} & \lambda_1^{(2t-1)} & \cdots & \lambda_{2t-1}^{(2t-1)} \end{pmatrix}$$

$$\begin{pmatrix} 1 & 1 & \cdots & 1 \\ \alpha^0 & \alpha^1 & \cdots & \alpha^{n-1} \\ \vdots & \vdots & & \vdots \\ \alpha^{0 \cdot (2t-1)} & \alpha^{1 \cdot (2t-1)} & \cdots & \alpha^{(n-1) \cdot (2t-1)} \end{pmatrix}$$

$$\begin{pmatrix} \Lambda^{(0)}(\alpha^0) & \Lambda^{(0)}(\alpha^1) & \cdots & \Lambda^{(0)}(\alpha^{n-1}) \\ \Lambda^{(1)}(\alpha^0) & \Lambda^{(1)}(\alpha^1) & \cdots & \Lambda^{(1)}(\alpha^{n-1}) \\ \vdots & \vdots & & \vdots \\ \Lambda^{(2t-1)}(\alpha^0) & \Lambda^{(2t-1)}(\alpha^1) & \cdots & \Lambda^{(2t-1)}(\alpha^{n-1}) \end{pmatrix}$$

It hence remains to find the polynomials $\Lambda^{(j)}(x) \in IF_q[x]$, $j=0, \ldots, 2t-1$, to determine $\tilde{H}$.

From Eq. (11) it can be seen that the columns $\underline{\tilde{h}}_{i_j}^T$ of $\tilde{H}$ at the parity locations $i_j$, $j=0, \ldots, 2t-1$, reduce to canonical unit vectors $\underline{\tilde{e}}_{i_j}^T$, $$\underline{\tilde{h}}_{i_j}^T = \begin{pmatrix} \Lambda^{(0)}(\alpha^{i_j}) \\ \Lambda^{(1)}(\alpha^{i_j}) \\ \vdots \\ \Lambda^{(2t-1)}(\alpha^{i_j}) \end{pmatrix} = \underline{e}_j^T, \tag{20}$$

where $\underline{e}_j = \Big( \underbrace{0, \ldots, 0}_{j}, 1, \underbrace{0, \ldots, 0}_{2t-j-1} \Big).$ Hence, for $j=0, 2t-1$, the polynomial $\Lambda^{(j)}(x)$ is the j-th Lagrange polynomial, i.e. the unique polynomial of degree $2t-1$ from $IF_q[x]$ satisfying $$\Lambda^{(j)}(\alpha^{i_k}) = \begin{cases} 1 & \text{for } k = j, \\ 0 & \text{for } k \neq j. \end{cases} \tag{21}$$

In order to find an expression for $\Lambda^{(j)}(x)$, first let $$\Lambda(x) = \prod_{j=0}^{2t-1} (x - \alpha^{i_j}) \tag{22}$$

$$= \lambda_0 + \lambda_1 x + \ldots + \lambda_{2t-1} x^{2t-1} + x^{2t}$$

denote a monic polynomial of degree 2t in $IF_q[x]$ with 2t roots $\alpha^{i_j}$, $j=0, \ldots, 2t-1$. As the index $i_j$ defines the location of the parity symbol $P_j$ within the codeword $\tilde{c}_{RS}$, the elements $\alpha^{i_j}$ will be called "parity locators" and the polynomial $\Lambda(x)$ "parity locator polynomial". Using this parity locator polynomial $\Lambda(x)$, the j-th Lagrange polynomial is given by $$\Lambda^{(j)}(x) = \frac{\Lambda(x)}{(x - \alpha^{i_j}) \cdot \Lambda'(\alpha^{i_j})} \qquad (23)$$

$$= \lambda_0^{(j)} + \lambda_1^{(j)} x + \ldots + \lambda_{2t-1}^{(j)} x^{2t-1},$$

where $\Lambda'(x)$ denotes the formal derivative of $\Lambda(x)$ in $\mathrm{IF}_q[x]$, $$\Lambda'(x) = \sum_{i=1}^{2t} i\lambda_i x^{i-1} \qquad (24)$$

$$= \lambda_1 + \lambda_3 x^2 + \lambda_5 x^4 + \ldots + \lambda_{2t-1} x^{2t-2}.$$

The coefficients $\lambda_i^{(j)}$; $i, j = 0, \ldots, 2t-1$, of the polynomials $\Lambda^{(j)}(x)$ from Eq. (23) completely determine the inverse $\tilde{B}^{-1}$ of the Vandermonde matrix $\tilde{B}$. In his research article "Inverses of Vandermonde matrices", The American Mathematical Monthly 71, No. 4 (1964) 410/411, Parker used a similar idea for efficiently inverting Vandermonde matrices.

An expression for the parity symbols $P_j$ can now be found by combining the definition of Reed-Solomon codes given in Eq. (5) with the parity check matrix $\tilde{H}$ from Eq. (19), $$\tilde{C}_{RS} = \{\underline{c} \in \mathrm{IF}_q^n : \tilde{H}\underline{c}^T = \underline{0}\}. \qquad (25)$$

Since $\tilde{H}$ arises from $H$ by means of a left multiplication with the matrix of full rank, the null space condition can be verified either for $H$ or for $\tilde{H}$. Due to Eq. (20), each parity symbol $P_j$ will appear only in the inner product of the j-th row of $\tilde{H}$ and the codeword $\underline{c}$, resulting in a linear system of equations, $$\tilde{C}_{RS} = \left\{ \underline{c} \in \mathrm{IF}_q^n : \sum_{l=0}^{n-1} \Lambda^{(j)}(\alpha^l) \cdot c_l = 0, j = 0, \ldots, 2t-1 \right\}. \qquad (26)$$

In order to determine the parity symbols $P_j$, we may define a modified codeword vector $$\hat{\underline{c}} = (I_0, I_1, 0, 0, I_3, I_4, \ldots, I_{k-2}, 0, I_{k-1}) \qquad (27)$$

$$\uparrow \quad \uparrow \qquad \qquad \uparrow$$

code locator index = $i_0$ $i_1$ $\qquad i_{2t-1}$ whose l-th entry $\hat{c}_l$ equals the data symbol at position l of the desired codeword if l does not denote the position of a parity symbol in said codeword, or equals zero if l denotes the position of a parity symbol in said codeword. It is verified from Eq. (11) that the parity symbols $P_j, j = 0, \ldots, 2t-1$, can be calculated using the expression $$P_j = \sum_{l=0}^{n-1} \hat{c}_l \cdot \Lambda^{(j)}(\alpha^l). \qquad (28)$$

A codeword $\underline{c} \in C_{RS}$ will then result from correctly combining the data vector $\underline{I}$ with the parity symbols $P_j$ at the corresponding positions $i_j$. As apparent from Eq. (28), the determination of the parity symbol $P_j$ can hence be reduced to the evaluation of a polynomial $\Lambda^{(j)}$ of a degree that is no larger than the number of parity symbols in the codeword. Compared with the brute force approach of inverting the matrix $\tilde{B}$ in Eq. (13), this greatly simplifies the encoding: the storage requirements are significantly reduced, and it becomes possible to prepare codewords with parity symbols at arbitrary positions "on the fly", i.e., as the codewords are received at the encoding station.

The surprising realization that the determination of the parity symbols, and thus the preparation of the codewords, can be reduced to a simple evaluation of a polynomial of limited degree greatly enhances the efficiency of the encoding. It is a further finding of the inventors that the polynomial $\Lambda^{(j)}$ can be chosen as a Lagrange polynomial as defined in Eq. (21) above. Due to it simplified structure, this allows to further enhance the efficiency of the encoding circuit.

Plugging Eq. (23) into Eq. (28) leads to $$P_j = \sum_{l=0}^{n-1} \hat{c}_l \cdot \frac{\Lambda(\alpha^l)}{(\alpha^l - \alpha^{i_j}) \cdot \Lambda'(\alpha^{i_j})} \qquad (29)$$

$$= \frac{1}{\Lambda'(\alpha^{i_j})} \cdot \sum_{l=0}^{n-1} \hat{c}_l \cdot \frac{\Lambda(\alpha^l)}{\alpha^l} \cdot \frac{1}{1 - \alpha^{i_j - l}}$$

The main advantage here is that the parity positions $i, j = 0, 2t-1$, are solely defined by the roots $\alpha^{i_j}$ of the parity locator polynomial $\Lambda(x)$, so it is sufficient to store the only $2 \cdot t$ coefficients from Eq. (22). The polynomial $\Lambda$ is seen not to depend on the parity symbol $P_j$, in the sense that $\Lambda$ depends merely on the parity pattern $\{i_j\}_{j=0, \ldots, 2t-1}$ as a whole, but not on the respective parity position $i_j$ individually. As a result, the same polynomial $\Lambda$ can be employed to determine all the parity symbols $P_j$ of a given parity pattern $\{i_j\}_{j=0, \ldots, 2t-1}$. This allows to further simplify the determination of the parity symbols and to reduce the storage requirements. In the exemplary embodiment, it remains to store the $2 \times t = 20$ coefficients of the parity locator polynomial $\Lambda$ for each of the 118 parity patterns under consideration. Hence, the storage requirements are reduced to (118 patterns)×(20 coefficients/pattern)×(1 byte/coefficient)=2,360 bytes. (30)

Compared to the 441,320 bytes of the brute-force approach according to Eq. (14), this amounts to a reduction by a factor of 187.

4. Hardware Implementation

A hardware implementation of an encoding circuit according to the foregoing embodiment of the present invention will now be described with reference to FIGS. 1 and 2.

An encoding station according to an embodiment of the invention receives, at a first input node, the data vector $\underline{I} = (I_0, I_1, \ldots, I_{k-1})$ containing the k data symbols to be transmitted, and, at a second node, the parity pattern $\{i_j\}_{j=0, \ldots, 2 \times t - 1}$ defining the positions at which the parity symbols $P_j$ are to be located within the codeword $\tilde{c}_{RS}$. As seen from Eq. (29), the following terms are then required to calculate the parity symbols $P_j$:

1. the data vector $\hat{\underline{c}}$ with zero-padded parity positions according to Eq. (27),
2. the term $$\frac{1}{1-x}$$

for any non-zero value $x \in IF_q$,
3. the term $$\frac{1}{\Lambda'(x)},$$

evaluated at $x = \alpha^{i_j}$, $j=0, \ldots, 2t-1$, as well as
4. the term $$\frac{\Lambda(x)}{x},$$

evaluated at $x = \alpha^l$, $l=0, \ldots, n-1$.

The values of the term $$\frac{1}{1-x},$$

for $x \in IF_q \setminus \{0\}$, can be computed ahead of time and stored in an array of memory elements, for example in a shift register. Because each parity symbol $P_j$ evaluates this term at a different element $x=\alpha^{i_j-i}$, all memory elements of such a shift register should preferably be accessible at all times. Also, due to the arbitrary parity positions $i_j$ the sequence $\{\alpha^{i_j-i}\}$, $l=0, \ldots, n-1$, may take on all q possible non-zero values of the field $IF_q$. Thus the shift register should be of size q-1. Additionally, the register containing the element with exponent $i_j$-l=0 should preferably be set to 0 to prevent numerical instability and avoid additional logic switches.

The final step is to do an efficient evaluation of the terms $$\frac{1}{\Lambda'(x)}$$

at $x=\alpha^{i_j}$, $j=0, \ldots, 2t-1$ and $$\frac{\Lambda(x)}{x}$$

at $x=\alpha^l$, $l=0, \ldots, n-1$. For finite fields $IF_q$ with the restriction of the size $q=2^m$, a comparison of the expressions for $$\frac{\Lambda(x)}{x} = \lambda_0 x^{-1} + \lambda_1 + \lambda_2 x + \lambda_3 x^2 + \lambda_4 x^3 + \ldots + \lambda_{2t-1} x^{2t-2} + \lambda_{2t} x^{2t-1} \quad (31)$$

$$\Lambda'(x) = \lambda_1 + \lambda_3 x^2 + \ldots + \lambda_{2t-1} x^{2t-2} \quad (32)$$

yields that both terms share monomials of the form $\lambda_{2i+1} x^{2i}$ for i=0, t-1. As a result, the evaluation of the term $\Lambda'(x)$ is a byproduct of the evaluation of $$\frac{\Lambda(x)}{x}.$$

The value of $\Lambda'(x)$ is then simply inverted to get the value of $$\frac{1}{\Lambda'(x)} \cdot A$$

very efficient architecture for simultaneously evaluating $\Lambda'(x)$ and $$\frac{\Lambda(x)}{x}$$

is a combined Chien search circuit as described in R. Chien, "Cyclic Decoding Procedures for Bose-Chaudhuri-Hocquenghem Codes", IEEE Transactions on Information Theory, vol. 10, no. 4, pp. 357-363, October 1964. If the memory elements are initialized with the coefficients $\lambda_0, \ldots, \lambda_{2t}$ of $$\frac{\Lambda(x)}{x},$$

this circuit will consecutively output the values of $$\frac{1}{\Lambda'(\alpha^l)} \text{ and } \frac{\Lambda(\alpha^l)}{\alpha^l}$$

for $l=0, \ldots, n-1$ with each clock cycle.

A Chien circuit 10 for evaluating the parity locator polynomial and its derivative is illustrated in FIG. 1. Circuit 10 comprises a first summing circuit 12 with a plurality of first registers 14, 14', 14", holding the even powers $\alpha^2$, $\alpha^4$, $\alpha^6$ etc. of the primitive element $\alpha$. Only three such first registers are shown in the illustration of FIG. 1. However, it is to be understood that the first summing circuit 12 comprises a sufficient number of first registers for all the even powers up to $\alpha^{2t-2}$.

As shown in FIG. 1, in the first summing circuit 12 these even powers $\alpha^2$, $\alpha^4$, $\alpha^6$ etc. are multiplied with the respective coefficients $\lambda_3$, $\lambda_5$, $\lambda_7$ etc. and are added to coefficient $\lambda_1$ to produce the value of the derivative $\Lambda'(x)$ of the parity locator polynomial according to Eq. (32) at a first output line 16.

FIG. 1 further shows a second summing circuit 18 with a second plurality of registers 20, 20', 20", 20''' holding the odd powers $\alpha^{-1}$, $\alpha^1$, $\alpha^3$, $\alpha^5$ etc. of the primitive element $\alpha$. Only four such registers are depicted in the illustration of FIG. 1. However, it is to be understood that the second summing circuit comprises enough registers to store all of the odd powers necessary for the determination of $\Lambda(x)/x$ according to Eq. (31) above. The odd powers $\alpha^{-1}$, $\alpha^1$, $\alpha^3$, $\alpha^5$ etc. are multiplied with respective coefficients $\lambda_0$, $\lambda_2$, $\lambda_4$, $\lambda_6$ etc. and are added to produce an output at a second output line 22.

The third summing circuit 24 links the first output line 16 of the first summing circuit 12 to the second output line 22 of the second summing circuit 18, and is adapted to add the output of the first summing circuit 12 to the output of the second summing circuit 18. As is apparent from the description of the summing circuits as well as from Eq. (31) and (32), the third summing circuit 24 then outputs the value of $$\frac{\Lambda(x)}{x}$$

at a third output line 26.

The architecture of the circuit thus makes efficient use of the fact that the terms $$\frac{\Lambda(x)}{x}$$

and $\Lambda'(x)$ share monomials of the even powers of x, and hence allows to evaluate both terms simultaneously. As a result, the parity symbols $P_j$ can be evaluated more quickly, and hence more efficiently.

In the circuit shown in FIG. 1, each of the registers 14, 14', 14"; 20, 20', 20", 20''' comprise a feedback loop 15, 15', 15", 21', 21", 21''' connecting the output of the register to the register input. By means of these feedback loops, the power of the element hold in the respective registers is automatically increased in every register clock cycle. Hence, the terms $$\frac{\Lambda(\alpha^\ell)}{\alpha^\ell}$$

and $\Lambda'(\alpha^h)$ can be subsequently evaluated for $l=0, \ldots, n-1$ without reinitialization of the registers 14, 14', 14"; 20, 20', 20", 20''', which saves both time and memory space.

A hardware circuit of an encoder according to an embodiment of the present invention will now be described with reference to FIG. 2. In the illustration of FIG. 2, reference numeral 10 denotes the combined Chien search circuit with first output line 16 and third output line 26, as described previously with reference to FIG. 1. An inverter 58 appended to the first output line 16 inverts the first output of the Chien circuit 10 to produce $$\frac{1}{\Lambda'(\alpha^\ell)}.$$

The encoder further comprises a shift register block 28 in which the values $$\frac{1}{1-\alpha^{ij-\ell}}$$

are prestored and output on demand on a fourth output line 30 as well as an input node 32 for receiving the data vector I and a multiplier 34 for multiplying the value $$\frac{\Lambda(\alpha^\ell)}{\alpha^\ell}$$

with the corresponding element of input vector ĉ as defined in Eq. (27) above.

The encoder additionally has a plurality of parity locator circuits 36, 36' corresponding in number to the number 2t of parity symbols $P_j$ in the codeword. All these parity locator circuits share the same architecture, and hence FIG. 2 shows only two such circuits for the sake of clarity. The circuits 36, 36' comprise first input nodes 38, 38' connected to the output of the multiplier 34, second input nodes 40, 40' connected to the fourth output line 30, and third input nodes 42, 42' connected to the first output line 14 of the Chien search block 10. By reading the respective outputs from the Chien search block 10 and the shift register 28 as well as from the multiplier 34, each of the parity locator circuits 36, 36' constitutes an implementation of Eq. (29) to determine the corresponding parity symbol $P_j$. The parity symbols $P_0, \ldots, P_{2t-1}$ thus computed are output at output nodes 44, 44', and are subsequently input, together with the data vector $I_1$, into a codeword buffer 46, which then yields the codeword vector c at an output node 48.

As can be seen by inspection of Eq. (29) as well as from the illustration of FIG. 2, each of the parity locator circuits 36, 36' can be implemented with merely two multipliers, one adder, and one selection switch each. A first multiplier 50, 50' is connected to the first input node 38, 38' and the second input note 40, 40', and is adapted to multiply the output of the shift register 28 with the output of multiplier 34. The adder 54, 54' is connected to the output of the first multiplier 50, 50' and serves to compute the sum in Eq. (29). The selection switch 56, 56' selects the corresponding value from the first output node 14 of the Chien search block 26, which is then multiplied at the second multiplier 52, 52' with the output of the adder 54, 54' to determine the parity symbol $P_j$.

Since both the Chien search block 10 and the shift register 28 likewise require only standard components, the encoder according to the present invention is efficient in terms of hardware and memory and can be easily implemented both in an integrated circuit or in a hardwired design. The hardware requirements for the implementation of a Reed-Solomon encoder according to an embodiment of the present invention are summarized in Table 1.

TABLE 1

| Hardware Requirements | |
|---|---|
| Item | Description |
| Memory | q − 1 registers storing $\frac{1}{1-\alpha^{ij-l}}$ |
| | 2t + 1 registers in Chien search |
| | 2t registers storing the values $\frac{1}{\Lambda'(\alpha^{ij})}$ |
| | 2t registers in summation |
| | n registers for codeword buffer |
| Adders | 2t adders in Chien search |
| | 2t adders in summation |
| Multipliers | 2t constant multipliers in Chien search |
| | 2t + 1 variable multipliers for parity symbols |
| | 2t variable multipliers for normalization |
| Inverters | 1 inverter for $\frac{1}{\Lambda'(\alpha^{ij})}$ after Chien search |
| Logic Switches | 2t logic switches to select $\frac{1}{\Lambda'(\alpha^{ij})}$ |

5. Generalized Reed-Solomon Codes and Alternate Codes

As will now be described in additional detail, the determination of the parity check symbols $P_j$ can be generalized with only minor amendments to the larger classes of alternant codes and generalized Reed-Solomon codes. In these generalizations, the determination of the parity symbols can likewise be reduced to the step of evaluating a polynomial of a degree that is no larger than the number of parity symbols in the codeword, and hence the same advantages over the prior art result.

Let $\underline{a}=\{a_0, a_1, \ldots, a_{n-1}\} \in IF_q$ be a set of $n \leq q$ distinct and nonzero elements of a finite field $IF_q$, where q is again the size of the field. Let $\underline{y}=\{y_0, y_1, \ldots, y_{n-1}\}$ denote a set of n nonzero (but not necessarily distinct) elements of $IF_q$. A t-error-correcting Generalized Reed-Solomon code of length n and dimension k=n−2t over the field $IF_q$ may be defined as $$C_{GRS}(IF_q, n, t, \underline{a}, \underline{y}) = \left\{ c \in IF_q^n : \sum_{i=0}^{n-1} y_i c_i a_i^j = 0, j = 0, \ldots, 2t-1 \right\}. \quad (33)$$

Regular Reed-Solomon codes described previously with respect to the first embodiment correspond to the special case wherein the code locators $a_i$ satisfy the equation $a_i = \alpha^j$ for some primitive element a of the field $IF_q$ for all i=0, ..., n−1, and $y_i$=1 for all i=0, ..., n−1.

As before, we can also define Generalized Reed-Solomon codes as the set of all vectors c lying in the null space (kernel) of a parity check matrix $H_{GRS}$, i.e., $$GRS(IF_q, n, t, \underline{a}, \underline{y}) = \{\underline{c} \in IF_q^n : H_{GRS} \underline{c}^T = \underline{0}\}. \quad (34)$$

It is seen from Eq. (33) that the parity check matrix $H_{GRS}$ of a generalized Reed-Solomon code may be written as a product H=V·Y, $$H_{GRS} = \begin{pmatrix} 1 & 1 & 1 & \cdots & 1 \\ a_0 & a_1 & a_2 & \cdots & a_{n-1} \\ \vdots & \vdots & \vdots & & \vdots \\ a_0^{2t-1} & a_1^{2t-1} & a_2^{2t-1} & \cdots & a_{n-1}^{2t-1} \end{pmatrix} \begin{pmatrix} y_0 & 0 & \cdots & 0 \\ 0 & y_1 & \cdots & 0 \\ \vdots & & \ddots & \vdots \\ 0 & 0 & \cdots & y_{n-1} \end{pmatrix} = VY, \quad (35)$$

where the matrix V is a 2t×n Vandermonde matrix, whose (i+1)th column $v_i^T$ consists of 2t consecutive powers of the corresponding code locator element $a_i$ for i=0, ..., n−1. Y as an (n×n) diagonal matrix with non-zero (but not necessarily distinct) diagonal elements $y_i$.

As described for the first embodiment, the generalized parity check matrix $H_{GRS}$ can again be transformed into the canonical form $\tilde{H}_{GRS}$ of Equation (11) by means of multiplication with the inverse of some matrix $\tilde{B}$, $$\tilde{H}_{GRS} = \tilde{B}^{-1} \cdot \tilde{H}_{GRS} = \tilde{B}^{-1} \cdot V \cdot Y \quad (36)$$

Since V is a Vandermonde matrix and $y_i \neq 0$ for all i=0, ..., n−1, $\tilde{B}^{-1}$ is again guaranteed to exist. Defining $\lambda_i^j = (\tilde{B}^{-1})_{ji}$ for i, j=0, ..., 2t−1 as in Eq. (19) and the polynomials $$\Lambda^{(j)}(a_l) = \lambda_0^{(j)} \cdot 1 + \lambda_1^{(j)} \cdot a_l + \ldots + \lambda_{2t-1}^{(j)} a_l^{2t-1} \quad (37)$$

as in Eq. (18), we see from Eq. (36) and Eq. (11) that $$\Lambda^{(j)}(a_{i_k}) = \begin{cases} \dfrac{1}{y_{i_j}} & \text{for } k = j, \\ 0 & \text{for } k \neq j, \end{cases} \quad (38)$$

where the integers $i_j$, j=0, ..., 2−1 denote the positions of the parity symbols $P_j$ within the codeword c. The non-zero coefficients $y_{i_j}$, j=0, ..., 2·−1 take care of the multiplication by the matrix Y in the definition of the generalized parity check matrix $H_{GRS}$ in Eq. (36). Defining the parity locator polynomial $$\Lambda(x) = \prod_{j=0}^{2t-1} (x - a_{i_j}) \quad (39)$$

$$= \lambda_0 + \lambda_1 x + \ldots + \lambda_{2t-1} x^{2t-1} + x^{2t}$$

we then have $$\Lambda^{(j)}(x) = \frac{1}{y_{i_j}} \cdot \frac{\Lambda(x)}{(x - a_{i_j}) \cdot \Lambda'(a_{i_j})}, \quad (40)$$

where $\Lambda'$ again denotes the formal derivative of $\Lambda$.

Defining the modified codeword vector ĉ as in Eq. (27) above, the parity symbol $P_j$ may then be given the expression $$P_j = \sum_{l=0}^{n-1} \hat{c}_l \cdot \frac{1}{y_{i_j}} \cdot \frac{\Lambda(a_l)}{(a_l - a_{i_j}) \cdot \Lambda'(a_{i_j})} \quad (41)$$

$$= \frac{1}{y_{i_j}} \cdot \frac{1}{\Lambda'(a_{i_j})} \cdot \sum_{l=0}^{n-1} \hat{c}_l \cdot \frac{\Lambda(a_l)}{a_l} \cdot \frac{1}{1 - a_{i_j}/a_l}.$$

As can be seen from a comparison of Equations (40) and (29), the expression for the parity symbol $P_j$ according to the second embodiment reduces to Eq. (29) by setting $y_j$=1 for all j=0, ..., 2·t−1 and $a_k = \alpha^k$ for each k=0, ..., n−1. While being a generalization of the first embodiment, inspection of Eq. (40) shows that the method according to the second embodiment still allows to compute the parity symbols by evaluating a polynomial $\Lambda$ of a degree that is no larger than the number of parity symbols in the codeword. As described above for the previous embodiment, this allows for a simplified determination of the parity symbols and a substantial reduction of the storage requirements.

From Eq. (40), we see that the following terms are required to calculate the parity symbol $P_j$, 1. the data vector ĉ, with zero-padded parity positions according to Eq. (27),
2. the term $$\frac{1}{1-x}$$

for any non-zero value of $x \in IF_q$, 3. the values $$\frac{1}{y_{i_j}}$$

for j=0, ..., 2t−1, 4. the term $$\frac{1}{\Lambda'(x)},$$

evaluated at $x=a_{i_j}$, $j=0, \ldots, 2t-1$, as well as
5. the term $$\frac{\Lambda(x)}{x},$$

evaluated at $x=a_l$, $l=0, \ldots, n-1$

Figure 3:
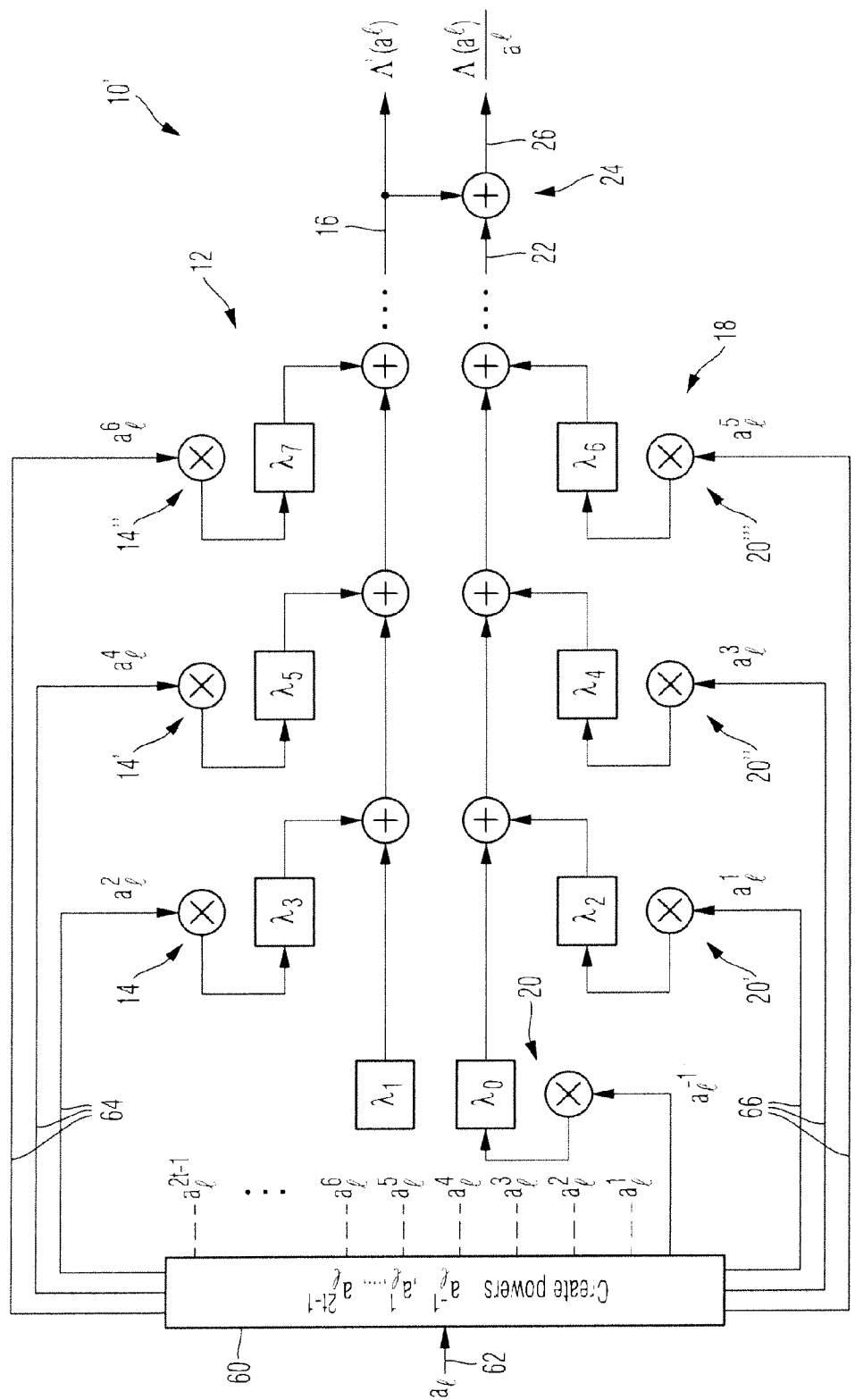
FIG. 3 is a schematic circuit diagram illustrating the simultaneous evaluation of the parity locator polynomial and its derivative according to a second embodiment of the present invention.

The parity symbols $P_j$ can hence be determined in a hardware implementation of an encoding circuit that is very similar to the encoding described with reference to the first embodiment in Section 4 above. A generalized Chien circuit 10' for evaluating the parity polynomial and its derivative according to the method of the second embodiment is illustrated in FIG. 3. The circuit largely corresponds to the one depicted in FIG. 1, and like elements share the same reference numerals.

The initialization register 60 receives the code locator element $a_l$ via an input line 62, and creates and holds the powers $a_l^{-1}, a_l, \ldots, a_l^{2t-1}$. The even powers are then loaded into the registers 14, 14', 14" of the first summing circuit 12 by means of first output lines 64 of the initialization register 60, while the odd powers are transferred to the registers 20, 20', 20", 20''' of the second summing register 18 via second output lines 66.

The circuit 10' then proceeds to compute $\Lambda'(a_l)$ at the first output line 16 and $$\frac{\Lambda(a_l)}{a_l}$$

at the third output line 26, just as described with reference to FIG. 1 above.

Afterwards, the initialization register 60 can be provided with another code locator element, and so forth for all code locator elements $a_l$, $l=0, \ldots, n-1$. Since the first and second registers are consecutively initialized with the respective code locator element, the feedback loops 15, 15', 15" and 21, 21', 21", 21''', respectively, shown in FIG. 1 and described with reference to the first embodiment are no longer required.

The hardware circuit of an encoder according to the second embodiment will now be described with reference to FIG. 4. The hardware circuit employs the generalized Chien search block 10' instead of the Chien search block 10, but is otherwise very similar to the hardware circuit of the first embodiment, as described previously with reference to FIG. 2. Corresponding elements will again be denoted by the same reference signs, and their description will be omitted in order to avoid unnecessary duplication.

Besides the shift register 28 for storing the values $$\frac{1}{1-a_{i_j}/a_l},$$

the encoder circuit further comprises a second shift register block 68 for storing the multipliers $$\frac{1}{y_l}.$$

The parity locator circuits 36, 36' are adapted accordingly and additionally comprise fourth input nodes 70, 70', respectively, for connection to the second shift register block 68, as well as second selection switches 72, 72' for selecting the corresponding value $$\frac{1}{y_{i_j}}$$

and multiplying it with the output of the adder 54, 54' at third multipliers 74, 74'. The parity locator circuit 36, 36' then outputs the corresponding parity symbol $P_j$ according to Eq. (40) at the respective output node 44, 44'. The parity symbols $P_0, \ldots, P_{2t-1}$ thus determined are input, together with the data vector $I_l$ received at data input node 32, into the codeword buffer 46, which yields the codeword vector c at output node 48.

Figure 2:
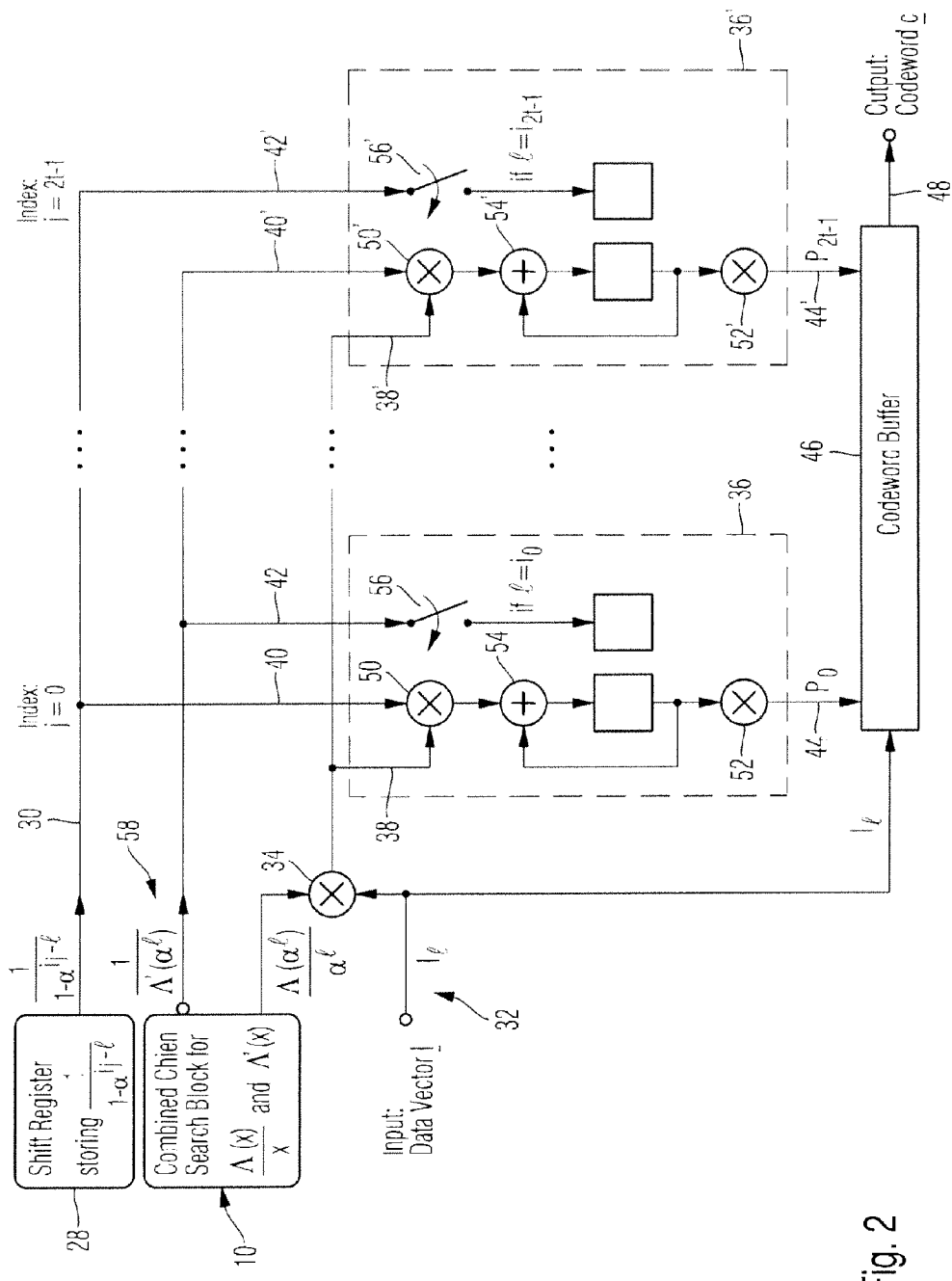
FIG. 2 is a schematic hardware circuit of an encoder according to the first embodiment.
Figure 4:
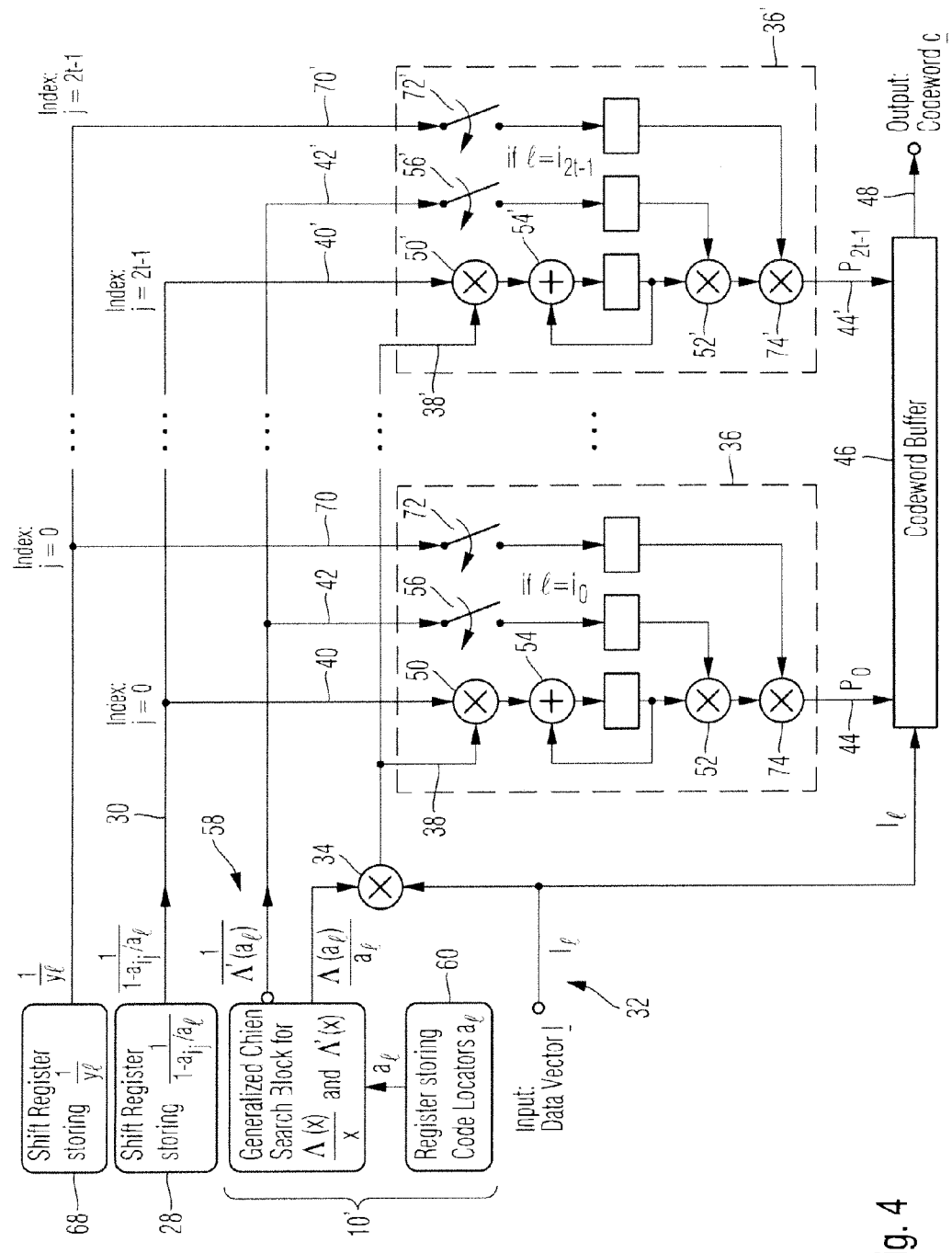
FIG. 4 is a schematic hardware circuit of an encoder according to the second embodiment.

A comparison of FIG. 4 with FIG. 2 shows that the generalized encoder circuit according to the second embodiment, despite being adapted to accommodate a much larger class of codes, requires only a slightly larger number of components, namely an initialization register 60, a second shift register block 68 for storing the multipliers $$\frac{1}{y_l},$$

and an additional selection switch 72 and multiplier 74 for each parity locator circuit 36, 36'. Since these are again standard components, the encoder according to the second embodiment likewise provides a very efficient implementation for determining codewords with parity symbols at arbitrary parity locations.

6. Generalized Reed-Solomon Codes by Interleaving

According to a third embodiment of the present invention, the determination of the parity symbols for a generalized Reed-Solomon code as defined in Eq. (33) can be reduced to the determination of parity symbols for a regular Reed-Solomon code. This approach exploits the property that the base elements $a_0, a_1, \ldots, a_{n-1}$ of the Vandermonde matrix V as defined in Eq. (35) are a subset of all $q-1$ possible nonzero elements of the finite field $\mathbb{F}_q$, albeit in no particular order. Hence, there exists a column permutation matrix $P_{Perm}$, such that $$V = \begin{pmatrix} 1 & 1 & 1 & \ldots & 1 \\ a_0 & a_1 & a_2 & \ldots & a_{n-1} \\ \vdots & \vdots & \vdots & & \vdots \\ a_0^{2t-1} & a_1^{2t-1} & a_2^{2t-1} & \ldots & a_{n-1}^{2t-1} \end{pmatrix} \quad (42)$$

$$= \begin{pmatrix} 1 & 1 & 1 & \ldots & 1 \\ \alpha^0 & \alpha^1 & \alpha^2 & \ldots & \alpha^{q-2} \\ \vdots & \vdots & \vdots & & \vdots \\ \alpha^{0 \cdot (2t-1)} & \alpha^{0 \cdot (2t-1)} & \alpha^{0 \cdot (2t-1)} & \ldots & \alpha^{(q-2)(2t-1)} \end{pmatrix}.$$

$$\begin{pmatrix} (q-1) \times n \text{ Column} \\ \text{Permutation Matrix} \end{pmatrix}$$

$$= \tilde{V} \cdot P_{Perm}$$

The matrix $\tilde{V}$ with base elements $\{1, \ldots, \alpha, q-2\}$ is again a Vandermonde matrix, and corresponds to the parity check matrix of a regular Reed-Solomon code with code length n=q−1, as described in Section 1. Combining Eq. (42) with Eq. (35), we see that $$H_{GRS} = \tilde{V} P_{Perm} Y. \quad (43)$$

We may hence employ an encoder circuit according to the first embodiment, provided the input vector I is permuted and padded so that it corresponds to the input vectors of a regular Reed-Solomon code of code length n=q−1. Once the encoding is completed, the permutation may be reversed to restore the original order, and the codeword symbols may be multiplied by the corresponding elements $y_i$ of Y.

Figure 5:
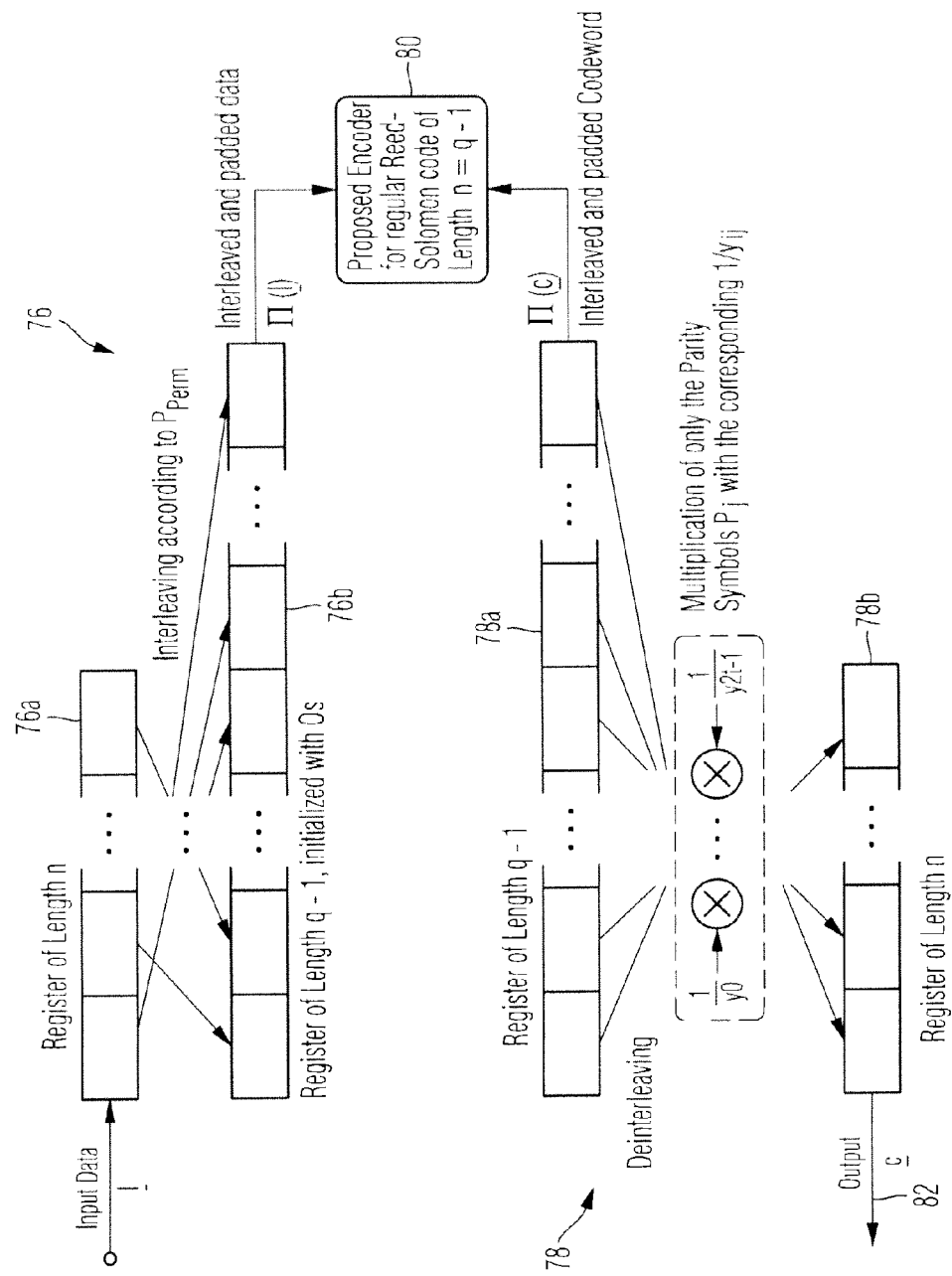
FIG. 5 illustrates interleaving and deinterleaving means for permuting the data symbols according to a third embodiment of the present invention.

An encoding circuit according to the third embodiment comprising an interleaving circuit 76 and a deinterleaving circuit 78 will now be described with reference to FIG. 5.

The interleaving circuit 76 comprises an input register 76a of length n to hold the input data vector I, and an output register 76b of length q−1, which is initialized with zeros. The interleaving circuit 76 is adapted to permute and pad the input data vector I according to the permutation matrix $P_{Perm}$. The resulting (permuted) input data vector II(I) is then encoded with an encoding circuit 80 for a regular Reed-Solomon code of code length n, for instance an encoding circuit according to the first embodiment, as described with reference to FIGS. 1 and 2 above. The encoding by means of encoding circuit 80 results in a codeword II(c) of length q−1, which can then be reduced to the original length n by deinterleaving with the permutation matrixes $P_{Perm}$ at deinterleaving means 78. Deinterleaving means 78 comprise an input register 78a of length q−1 for holding the interleaved and padded codeword II(c) generated by the encoding circuit 80, as well as an output register 78b of length n for holding the resulting codeword c, which is obtained from II(c) by inversing the permutation $P_{Perm}$ and by multiplying the parity symbols $P_j$ with the corresponding coefficients $$\frac{1}{y_{i_j}}.$$

The codeword c of the generalized Reed-Solomon code with arbitrary parity positions is then output at an output line 82, and may subsequently be sent over a communication channel.

According to the third embodiment, codewords of a generalized Reed-Solomon code with arbitrary parity positions may be generated by means of an encoding circuit 80 for a regular Reed-Solomon code, which requires less hardware and computational resources than the encoding circuit described with reference to FIGS. 3 and 4. The method according to the third embodiment is particularly advantageous whenever the code length n is not much smaller than the field size q−1.

The description and the figures merely serve to illustrate the invention and its numerous advantages, and should not be understood to restrict or limit the invention in any way. The scope of the invention is determined solely by the appended set of claims.

REFERENCE SIGNS

10, 10' Chien search block
12 first summing circuit
14, 14', 14" first registers
15, 15', 15" feedback loops of the first registers 14, 14', 14"
16 first output line
18 second summing circuit
20, 20', 20", 20''' second registers
21, 21', 21", 21''' feedback loops of the second registers 20, 20', 20", 20'''
22 second output line
24 third summing circuit
26 third output line
28 shift register block
30 fourth output line
32 data input node
34 multiplier
36, 36' parity locator circuits
38, 38' first input nodes of parity locator circuits 36, 36'
40, 40' second input nodes of parity locator circuits 36, 36'
42, 42' third input nodes of parity locator circuits 36, 36'
44, 44' output nodes of parity locator circuits 36, 36'
46 codeword buffer
48 output node of codeword buffer 46
50, 50' first multiplier of parity locator circuit 36, 36'
52, 52' second multiplier of parity locator circuit 36, 36'
54, 54' adder of parity locator circuit 36, 36'
56, 56' selection switch of parity locator circuit 36, 36'
58 inversion circuit
60 initialization register
62 input line of the initialization register 60
64 first output lines of the initialization register 60
66 second output lines of the initialization register 60
68 second shift register block
70, 70' fourth input nodes of parity locator circuit 36, 36'
72, 72' second selection switch of parity locator circuit 36, 36'
74, 74' third multiplier of parity locator circuit 36, 36'
76 interleaving circuit
76a input register of interleaving circuit 76
76b output register of interleaving circuit 76
78 deinterleaving circuit
78a input register of deinterleaving circuit 78
78b output register of deinterleaving circuit 78
80 encoding circuit
82 output line

The invention claimed is:

1. A method of encoding data for transmission from a source to a destination over a communication channel by means of an error-correcting code, said error-correcting code being defined by a parity check matrix (H) having or comprising a Vandermonde structure, the method comprising the steps of:
   receiving a plurality of data symbols ($I_l$); and
   preparing at least one codeword (c) of said error-correcting code at an encoding station, said codeword to be transmitted over said communication channel and comprising said plurality of data symbols ($I_l$) and a plurality of parity symbols ($P_j$);
   wherein said step of preparing said codeword (c) comprises the steps of:
   selecting one out of a plurality of parity patterns ($\{i_j\}_{j=0, \ldots, 2t-1}$), said parity pattern ($\{i_j\}_{j=0, \ldots, 2t-1}$) determining the positions at which said parity symbols ($P_j$) are located within said codeword (c); and
   determining said parity symbols ($P_j$) on the basis of said data symbols ($I_l$) and said selected parity pattern ($\{i_j\}_{j=0, \ldots, 2t-1}$);
   characterized in that determining at least one of said parity symbols ($P_j$) is based on a step of evaluating a polynomial ($\Lambda^{(j)}, \Lambda$) of a degree that is no larger than the number of parity symbols ($P_j$) in said codeword (c);
   wherein said polynomial ($\Lambda^{(j)}$) is a Lagrange polynomial, i.e., $$\Lambda^{(j)}(a_{i_k}) = \begin{cases} \dfrac{1}{y_{i_j}} & \text{for } k = j, \\ 0 & \text{for } k \neq j, \end{cases}$$

wherein $\{a_0, a_1, \ldots, a_{n-1}\}$ is a set of n distinct and non-zero elements of a finite field, the positive integer n denoting the length of said codeword (c), $\{y_0, y_1, \ldots, y_{n-1}\}$ is a set of n non-zero elements of said finite field, j is a positive integer denoting the parity symbol, and $i_k$ is a positive integer denoting the position of the k-th parity symbol in said codeword according to said selected parity pattern.

2. The method according to claim 1, wherein $y_{i_j}=1$ for some or all $y_{i_j}$, 1 denoting a unit element of said field.

3. The method according to claim 1, wherein $a_k = a^k$ for all k=0, ..., n-1, α denoting a primitive element of said field.

4. The method according to claim 1, wherein said plurality of parity symbols ($F_j$) are solely defined in terms of the roots of said polynomial (Λ) and the position of the parity symbol within said codeword.

5. The method of claim 1, further comprising a step of permuting said data symbols ($I_l$) before preparing said codeword (c).

6. A method of encoding data for transmission from a source to a destination over a communication channel by means of an error-correcting code, said error-correcting code being defined by a parity check matrix (H) having or comprising a Vandermonde structure, the method comprising the steps of:
receiving a plurality of data symbols ($I_l$); and
preparing at least one codeword (c) of said error-correcting code at an encoding station, said codeword to be transmitted over said communication channel and comprising said plurality of data symbols ($I_l$) and a plurality of parity symbols ($P_j$);
wherein said step of preparing said codeword (c) comprises the steps of:
selecting one out of a plurality of parity patterns ($\{i_j\}_{j=0, \ldots, 2t-1}$), said parity pattern ($\{i_j\}_{j=0, \ldots, 2t-1}$) determining the positions at which said parity symbols ($P_j$) are located within said codeword (c); and
determining said parity symbols ($P_j$) on the basis of said data symbols ($I_l$) and said selected parity pattern ($\{i_j\}_{j=0, \ldots, 2t-1}$);
characterized in that determining at least one of said parity symbols ($P_j$) is based on a step of evaluating a polynomial ($\Lambda^{(j)}, \Lambda$) of a degree that is no larger than the number of parity symbols ($P_j$) in said codeword (c);
wherein the j-th parity symbol is determined by evaluating the equation $$P_j = \sum_{l=0}^{n-1} \hat{c}_l \cdot \Lambda^{(j)}(a_l)$$

for every parity symbol $P_j$, wherein n denotes the length of said codeword (c), $\Lambda^{(j)}$ denotes a polynomial of a degree that is no larger than the number of parity symbols in said codeword (c), $\{a_0, a_1, \ldots, a_{n-1}\}$ is a set of n distinct and non-zero elements of a finite field, and $\hat{c}_l$ equals the data symbol at position l of said codeword (c) if l does not denote a position of a parity symbol in said codeword (c), or equals 0 if l denotes a position of a parity symbol in said codeword (c).

7. The method according to claim 6, wherein said plurality of parity symbols ($P_j$) are solely defined in terms of the roots of said polynomial (Λ) and the position of the parity symbol within said codeword.

8. The method of claim 6, further comprising a step of permuting said data symbols ($I_l$) before preparing said codeword (c).

9. A method of encoding data for transmission from a source to a destination over a communication channel by means of an error-correcting code, said error-correcting code being defined by a parity check matrix (H) having or comprising a Vandermonde structure, the method comprising the steps of:
receiving a plurality of data symbols ($I_l$); and
preparing at least one codeword (c) of said error-correcting code at an encoding station, said codeword to be transmitted over said communication channel and comprising said plurality of data symbols ($I_l$) and a plurality of parity symbols ($P_j$);
wherein said step of preparing said codeword (c) comprises the steps of:
selecting one out of a plurality of parity patterns ($\{i_j\}_{j=0, \ldots, 2t-1}$), said parity pattern ($\{i_j\}_{j=0, \ldots, 2t-1}$) determining the positions at which said parity symbols ($P_j$) are located within said codeword (c); and
determining said parity symbols ($P_j$) on the basis of said data symbols ($I_l$) and said selected parity pattern ($\{i_j\}_{j=0, \ldots, 2t-1}$);
characterized in that determining at least one of said parity symbols ($P_j$) is based on a step of evaluating a polynomial ($\Lambda^{(j)}, \Lambda$) of a degree that is no larger than the number of parity symbols ($P_j$) in said codeword (c);
wherein said step of determining said parity symbols ($P_j$) comprises a step of evaluating said polynomial (Λ), and further evaluating its derivative (Λ'), said polynomial (Λ) being independent of said parity symbols ($P_j$).

10. The method according to claim 9, wherein said plurality of parity symbols ($P_j$) are solely defined in terms of the roots of said polynomial (Λ) and the position of the parity symbol within said codeword.

11. The method of claim 9, further comprising a step of permuting said data symbols ($I_l$) before preparing said codeword (c).

12. A method of encoding data for transmission from a source to a destination over a communication channel by means of an error-correcting code, said error-correcting code being defined by a parity check matrix (H) having or comprising a Vandermonde structure, the method comprising the steps of:
receiving a plurality of data symbols ($I_l$); and
preparing at least one codeword (c) of said error-correcting code at an encoding station, said codeword to be transmitted over said communication channel and comprising said plurality of data symbols ($I_l$) and a plurality of parity symbols ($P_j$);
wherein said step of preparing said codeword (c) comprises the steps of:
selecting one out of a plurality of parity patterns ($\{i_j\}_{j=0, \ldots, 2t-1}$), said parity pattern ($\{i_j\}_{j=0, \ldots, 2t-1}$) determining the positions at which said parity symbols ($P_j$) are located within said codeword (c); and
determining said parity symbols ($P_j$) on the basis of said data symbols ($I_l$) and said selected parity pattern ($\{i_j\}_{j=0, \ldots, 2t-1}$);
characterized in that determining at least one of said parity symbols ($P_j$) is based on a step of evaluating a polynomial ($\Lambda^{(j)}$, $\Lambda$) of a degree that is no larger than the number of parity symbols ($P_j$) in said codeword (c);

wherein the j-th parity symbol ($P_j$) is determined by evaluating the equation $$P_j = \frac{1}{y_{i_j}} \frac{1}{\Lambda'(a_{i_j})} \cdot \sum_{l=0}^{n-1} \hat{c}_l \cdot \frac{\Lambda(a_l)}{a_l} \cdot \frac{1}{1 - a_{i_j}/a_l}$$

for every parity symbol $P_j$, wherein n denotes the length of said codeword (c), $\Lambda$ denotes a polynomial of a degree that is no larger than the number of parity symbols in said codeword (c), said polynomial $\Lambda$ being independent of said parity symbols $P_j$, $\{a_0, a_1, \ldots, a_{n-1}\}$ is a set of n distinct and non-zero elements of a finite field, $\Lambda'$ denotes the first derivative of $\lambda$, $i_j$ is a positive integer denoting the position of the j-th parity symbol in said codeword, $\{y_0, y_1, \ldots, y_{n-1}\}$ is a set of n non-zero elements of said finite field, and $\hat{c}_l$ equals the data symbol at position l of said codeword if l does not denote a position of a parity symbol in said codeword, or equals 0 if l denotes a position of a parity symbol in said codeword.

13. The method according to claim 12, wherein said plurality of parity symbols ($P_j$) are solely defined in terms of the roots of said polynomial ($\Lambda$) and the position of the parity symbol within said codeword.

14. The method of claim 12, further comprising a step of permuting said data symbols ($I_l$) before preparing said codeword (c).

15. A non-transitory storage medium storing instructions readable by a computing device, such that the computing device, when executing said instructions, implements the method according to claim 1.

16. An encoder for encoding data to be transmitted from a source to a destination over a communication channel by means of an error-correcting code, said error-correcting code being defined by a parity check matrix (H) having or comprising a Vandermonde structure, said encoder comprising:

encoding means adapted to receive a plurality of data symbols ($I_l$) and to prepare at least one codeword (c) of said error-correcting code, said codeword (c) to be transmitted over said communication channel and comprising said plurality of data symbols ($I_l$) and a plurality of parity symbols ($P_j$); and pattern selection means adapted to select one out of a plurality of parity patterns ($\{i_j\}_{j=0, \ldots, 2t-1}$), said parity pattern ($\{i_j\}_{j=0, \ldots, 2t-1}$) determining the positions at which said parity symbols ($P_j$) are located within said codeword (c);

characterized in that said encoder is adapted to determine said parity symbols ($P_j$) on the basis of said data symbols ($I_l$) and said selected parity pattern ($\{i_j\}_{j=0, \ldots, 2t-1}$) by evaluating a polynomial ($\Lambda^{(j)}$, $\Lambda$) of a degree that is no larger than the number of parity symbols ($P_j$) in said codeword (c);

the encoder comprising a first summing circuit (12), a second summing circuit (18), and a third summing circuit (24), said third summing circuit (24) connecting an output line (16) of said first summing circuit (12) to an output line (22) of said second summing circuit (18), wherein said first summing circuit (12) comprises a plurality of first registers (14, 14', 14") adapted to hold a plurality of even powers of a primitive element ($\alpha$) of a finite field and a corresponding number of first coefficients ($\lambda_1, \lambda_3, \lambda_5, \lambda_7$), said second summing circuit (18) comprises a plurality of second registers (20, 20', 20", 20''') adapted to hold a plurality of odd powers of said primitive element ($\alpha$) and a corresponding number of second coefficients ($\lambda_0, \lambda_2, \lambda_4, \lambda_6$), and said third summing circuit (24) is adapted to add an output of said first summing circuit (12) to an output of said second summing circuit (18).

17. The encoder according to claim 16, wherein said first registers (14, 14', 14") and/or said second registers (20, 20', 20", 20''') each comprise a feedback loop (15, 15', 15"; 21, 21', 21", 21''') for said even and odd powers of said primitive element ($\alpha$), respectively.

18. The encoder according to claim 16, additionally comprising interleaving means (76) adapted to permute said data symbols ($I_l$) before preparing said codeword (c).

19. An encoder for encoding data to be transmitted from a source to a destination over a communication channel by means of an error-correcting code, said error-correcting code being defined by a parity check matrix (H) having or comprising a Vandermonde structure, said encoder comprising:

encoding means adapted to receive a plurality of data symbols ($I_l$) and to prepare at least one codeword (c) of said error-correcting code, said codeword (c) to be transmitted over said communication channel and comprising said plurality of data symbols ($I_l$) and a plurality of parity symbols ($P_j$); and pattern selection means adapted to select one out of a plurality of parity patterns ($\{i_j\}_{j=0, \ldots, 2t-1}$), said parity pattern ($\{i_j\}_{j=0, \ldots, 2t-1}$) determining the positions at which said parity symbols ($P_j$) are located within said codeword (c);

characterized in that said encoder is adapted to determine said parity symbols ($P_j$) on the basis of said data symbols ($I_l$) and said selected parity pattern ($\{i_j\}_{j=0, \ldots, 2t-1}$) by evaluating a polynomial ($\Lambda^{(j)}$, $\Lambda$) of a degree that is no larger than the number of parity symbols ($P_j$) in said codeword (c):

the encoder comprising a first summing circuit (12), a second summing circuit (18), a third summing circuit (24) and an initialization register (60), said first summing circuit (12) comprising a plurality of first registers (14, 14', 14") adapted to hold a plurality of even powers of an element ($a_l$) of a finite field and a corresponding number of first coefficients ($\lambda_1, \lambda_3, \lambda_4, \lambda_7$), said second summing circuit (18) comprising a plurality of second registers (20, 20', 20", 20''') adapted to hold a plurality of odd powers of said element ($a_1$) and a corresponding number of second coefficients ($\lambda_0, \lambda_2, \lambda_4, \lambda_6$), said initialization register (60) adapted to initialize said first registers (14, 14', 14") and said second registers (20, 20', 20", 20''') with said even and odd powers of said element ($a_l$), respectively, wherein said third summing circuit (24) connects an output line (16) of said first summing circuit (12) to an output line (22) of said second summing circuit (18), and is adapted to add an output of said first summing circuit (12) to an output of said second summing circuit (18).

20. The encoder according to claim 19, additionally comprising interleaving means (76) adapted to permute said data symbols ($I_l$) before preparing said codeword (c).

21. A non-transitory storage medium storing instructions readable by a computing device, such that the computing device, when executing said instructions, implements the method according to claim 6.

22. A non-transitory storage medium storing instructions readable by a computing device, such that the computing device, when executing said instructions, implements the method according to claim 9.

23. A non-transitory storage medium storing instructions readable by a computing device, such that the computing device, when executing said instructions, implements the method according to claim 12.

* * * * *